(12) United States Patent
Jang et al.

(10) Patent No.: US 7,898,075 B2
(45) Date of Patent: Mar. 1, 2011

(54) SEMICONDUCTOR PACKAGE HAVING RESIN SUBSTRATE WITH RECESS AND METHOD OF FABRICATING THE SAME

(75) Inventors: Chul-Yong Jang, Gyeonggi-do (KR);
Eun-Chul Ahn, Gyeonggi-do (KR);
Pyoung-Wan Kim, Gyeonggi-do (KR);
Taek-Hoon Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 194 days.

(21) Appl. No.: 12/202,036

(22) Filed: Aug. 29, 2008

(65) Prior Publication Data
US 2009/0065919 A1    Mar. 12, 2009

(30) Foreign Application Priority Data

Sep. 7, 2007    (KR) ............... 10-2007-0091225

(51) Int. Cl.
*H01L 23/02*    (2006.01)
*H01L 23/04*    (2006.01)

(52) U.S. Cl. ......... 257/698; 257/686; 257/E25.006; 257/E25.013; 257/E25.018; 257/E25.021; 257/E25.027; 257/E23.085

(58) Field of Classification Search ......... 257/686–733, 257/780–795, 678, 685, 777, E25.006, E25.013, 257/E25.018, E25.021, E25.027, E23.085; 438/109, FOR. 368, FOR. 426
See application file for complete search history.

(56) References Cited

U.S. PATENT DOCUMENTS

| 4,961,105 A * | 10/1990 | Yamamoto | 257/679 |
| 7,435,910 B2 * | 10/2008 | Sakamoto et al. | 174/260 |

FOREIGN PATENT DOCUMENTS

| JP | 2001-068796 | 3/2001 |
| JP | 2001-274324 | 10/2001 |
| KR | 2005-0117715 | 12/2005 |

OTHER PUBLICATIONS

English language abstract of Japanese Publication No. 2001-274324.
English language abstract of Japanese Publication No. 2001-068796.
English language abstract of Korea Publication No. 2005-0117715.

* cited by examiner

*Primary Examiner*—Jasmine J Clark
(74) *Attorney, Agent, or Firm*—Muir Patent Consulting, PLLC

(57) ABSTRACT

In one embodiment, a semiconductor package disclosed herein can be generally characterized as including a resin substrate having a first recess, a first interconnection disposed on a surface of the first recess, a first semiconductor chip disposed in the first recess, and an underfill resin layer substantially filling the first recess and covering a side surface of the first semiconductor chip. The first semiconductor chip is electrically connected to the first interconnection.

19 Claims, 7 Drawing Sheets

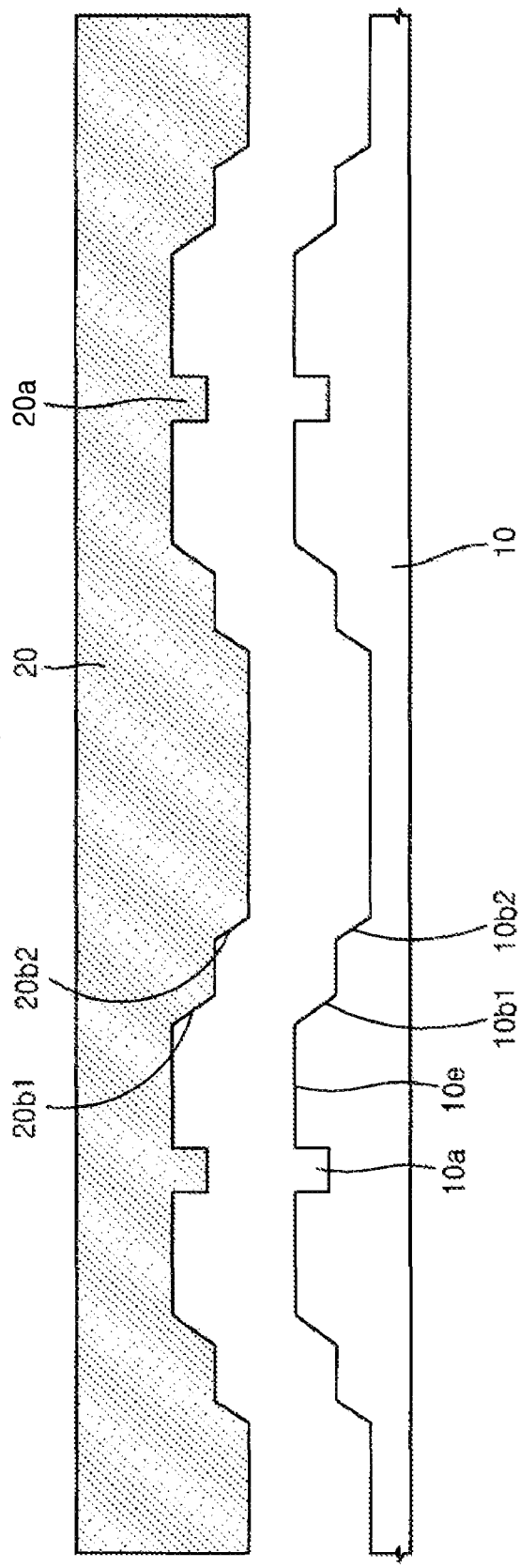
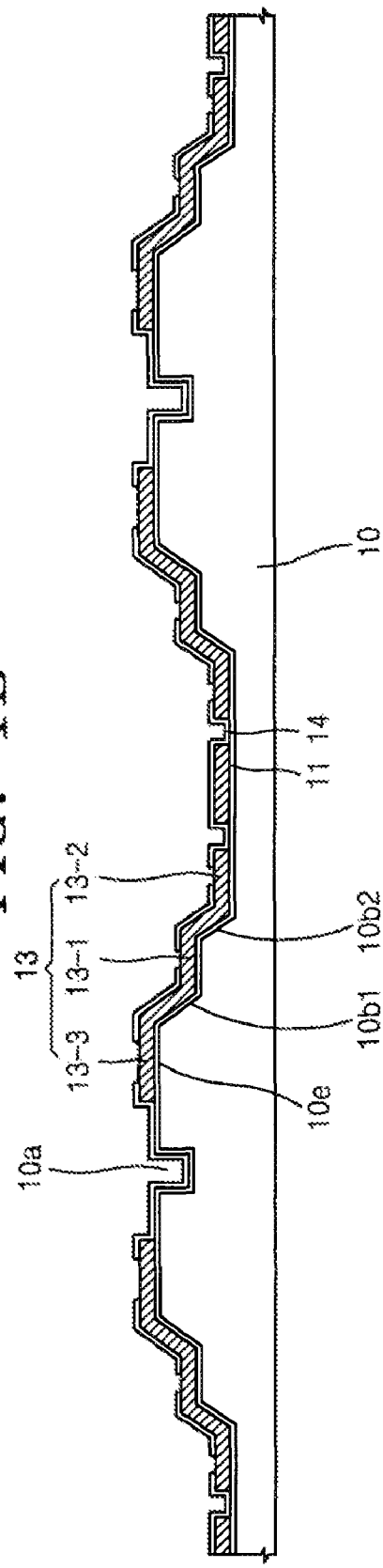
FIG. 1A
FIG. 1B

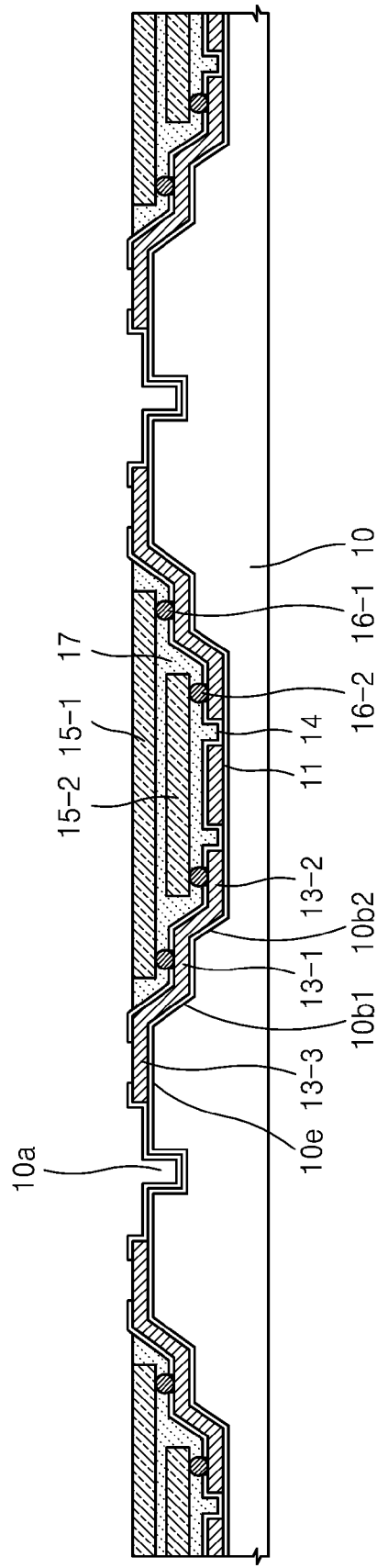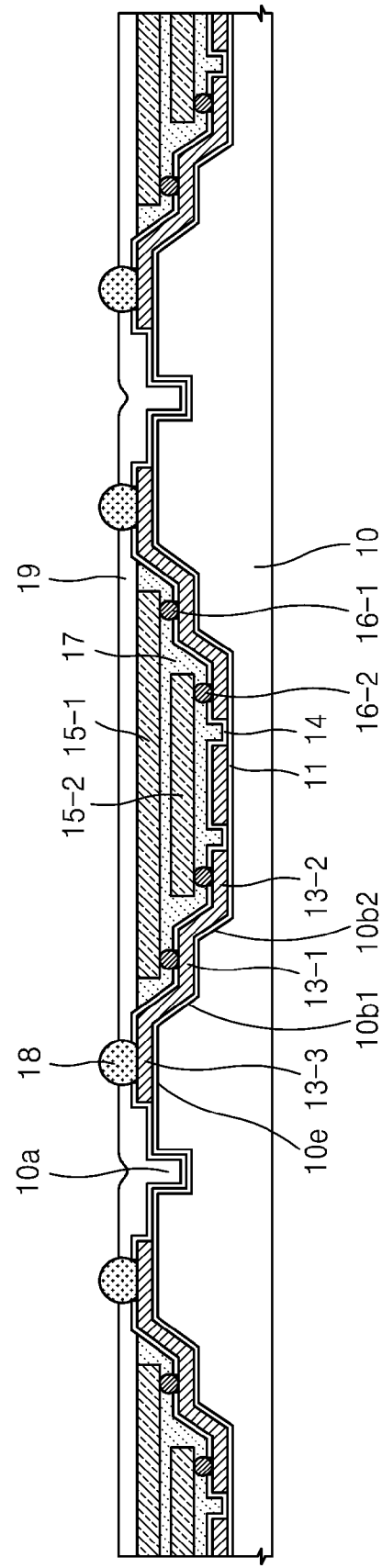

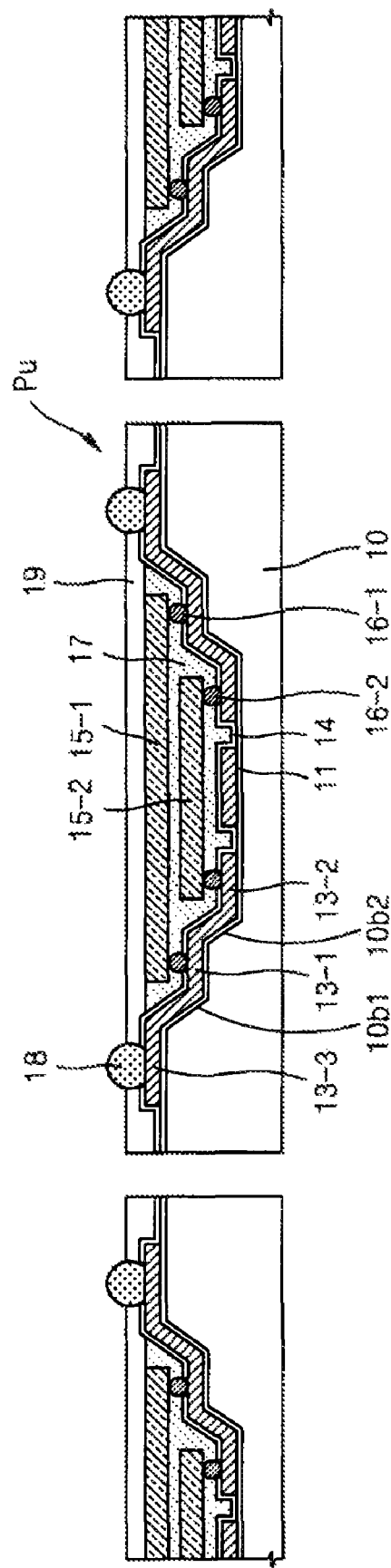

SEMICONDUCTOR PACKAGE HAVING RESIN SUBSTRATE WITH RECESS AND METHOD OF FABRICATING THE SAME

CROSS-REFERENCE TO RELATED PATENT APPLICATION

This application claims the benefit of Korean Patent Application No. 10-2007-0091225, filed on Sep. 7, 2007, the disclosure of which is incorporated herein in its entirety by reference.

BACKGROUND

Embodiments of the present invention relate generally to semiconductor packages and methods of fabricating the same. More particularly, embodiments of the present invention relate to a semiconductor substrate having a resin substrate with recesses and a method of fabricating the same.

SUMMARY

Some embodiments of the present invention can be characterized as providing a semiconductor package, and a method of fabricating the same, which is capable of having a reduced thermal stress and thickness, and which contains a semiconductor chip that is less susceptible to damage caused by an external impact.

One embodiment exemplarily described herein can be generally characterized as a semiconductor package that includes a resin substrate including a first recess; a first interconnection disposed on a surface of the first recess; a first semiconductor chip disposed in the first recess, wherein the first semiconductor chip is electrically connected to the first interconnection; and an underfill resin layer substantially filling the first recess and covering a side surface of the first semiconductor chip.

Another embodiment exemplarily described herein can be generally characterized as a semiconductor package that includes a resin substrate having an upper surface and a first recess extending from the upper surface to a first level below the upper surface; a first interconnection disposed within the first recess; an insulating buffer layer disposed within the first recess between the resin substrate and the first interconnection; and a first semiconductor chip disposed within the first recess and electrically connected to the first interconnection. The insulating buffer layer and the resin substrate may comprise different materials.

Yet another embodiment exemplarily described herein can be generally characterized as a stacked semiconductor package that includes a first unit semiconductor package; a second unit semiconductor package disposed over the first unit semiconductor package; and an external conductive protrusion connected to the first unit semiconductor package and the second unit semiconductor package. The first unit semiconductor package and the second unit semiconductor package may each include a resin substrate including a first recess and a second recess, wherein a bottom surface of the first recess is disposed between an upper surface and a lower surface of the resin substrate and wherein a bottom surface of the second recess is disposed between the bottom surface of the first recess and the lower surface of the resin substrate; an interconnection, wherein the interconnection is disposed within the first recess and the second recess; a first semiconductor chip disposed in the first recess and electrically connected to the interconnection; and a second semiconductor chip disposed in the second recess and electrically connected to the interconnection. The second unit semiconductor package may further include a through electrode extending through the resin substrate and electrically connecting the interconnection of the second unit semiconductor package with the external conductive protrusion. The interconnection of the first unit semiconductor package may be electrically connected to the external conductive protrusion.

BRIEF DESCRIPTION OF THE DRAWINGS

Exemplary details of embodiments of the present invention will become more apparent with reference to the attached drawings in which:

FIGS. 1A through 1E are sectional views illustrating a method of fabricating a semiconductor package according to an embodiment of the present invention;

DETAILED DESCRIPTION OF THE EMBODIMENTS

Figure 2:
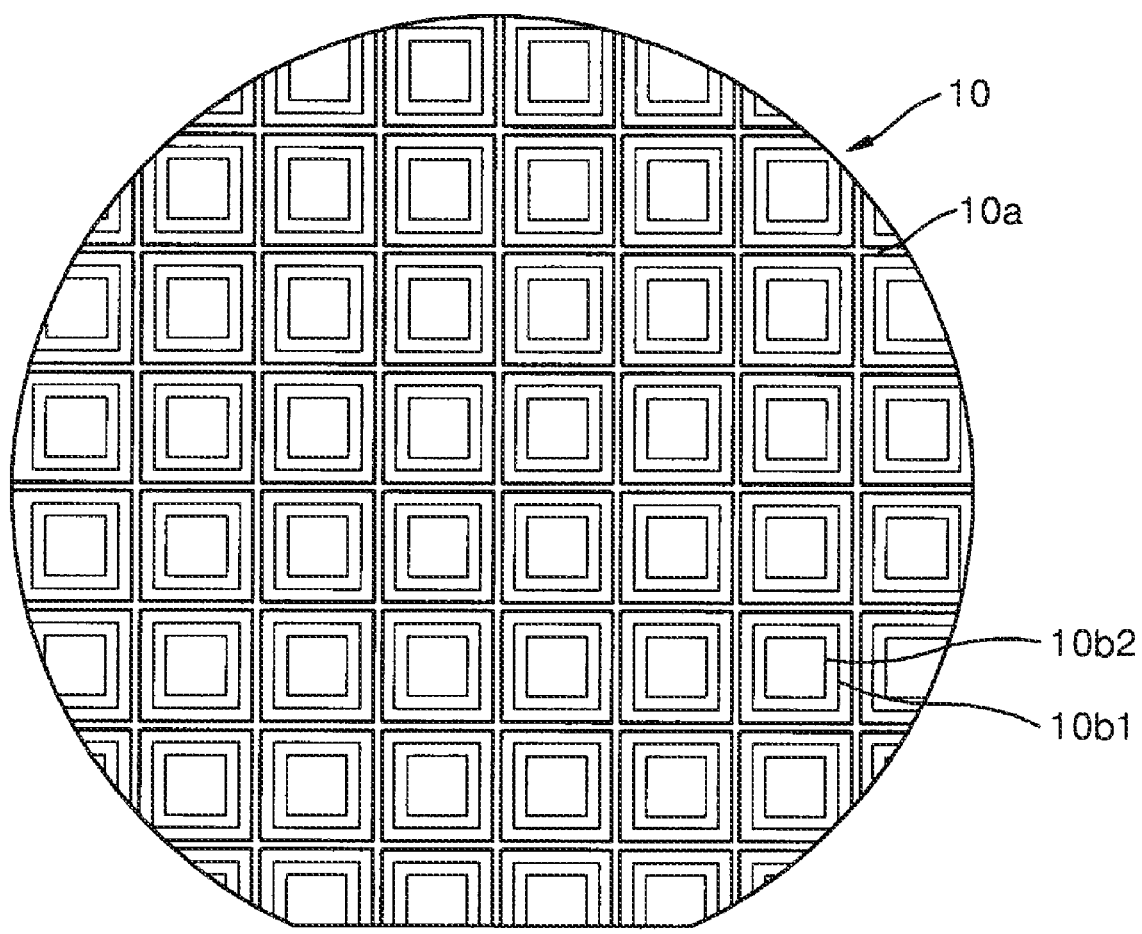
FIG. 2 is a plan view illustrating a top surface of a resin substrate illustrated in FIG. 1A.

Exemplary embodiments of the present invention will now be described more fully with reference to the accompanying drawings. These embodiments may, however, be realized in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

FIGS. 1A through 1E are sectional views illustrating a method of fabricating a semiconductor package according to an embodiment of the present invention. FIG. 2 is a plan view illustrating a top surface of a resin substrate illustrated in FIG. 1A.

Referring to FIGS. 1A and 2, a resin substrate 10 including a plurality of unit package regions is provided. The unit package regions may be defined by grooves 10a formed in the resin substrate 10, wherein the grooves 10a extend below an upper surface of the resin substrate 10. A first recess 10b1 is formed in each of the unit package regions and extends to a first level below the upper surface of the resin substrate 10. A peripheral region 10e is disposed between the first recess 10b1 and the grooves 10a, wherein the upper surface of the resin substrate 10 is disposed within the peripheral region 10e. Accordingly, the peripheral region 10e is disposed outside the first recess 10b1 and at least an edge of the peripheral region 10e is defined by the first recess 10b1. In one embodiment, a second recess 10b2 extends below a bottom surface of the first recess 10b1 to a second level below the upper surface of the resin substrate 10. As illustrated, a width of an upper portion of the second recess 10b2 is less than a width of the bottom surface of the first recess 10b1. In another embodiment, however, the second recess 10b2 may be omitted.

The resin substrate 10 including the first recess 10b1, the second recess 10b2, and the groove 10a may be fabricated using a mold 20. The mold 20 may include a first protrusion 20b1 corresponding to the first recess 10b1, a second protrusion 20b2 disposed on the first protrusion 20b1 and corresponding to the second recess 10b2, and a third protrusion 20a corresponding to the groove 10a.

In the embodiment exemplarily illustrated in FIG. 2, the resin substrate 10 may have a wafer shape. Accordingly, the resin substrate 10 does not require additional forming equipment because it can be loaded into semiconductor chip fabrication equipment (i.e., equipment into which a wafer is loaded) for an interconnection forming process or an insulating layer forming process, which will be described in greater detail below. It will be appreciated, however, that the shape of the resin substrate 10 is not limited to that of a wafer. For example, the resin substrate 10 may be square-shaped or the like.

The coefficient of thermal expansion (CTE) of the resin substrate 10 can be easily adjusted by adjusting the content or size of filler material contained in the resin substrate 10. As a result, a CTE difference between the resin substrate 10 and a semiconductor chip or an interconnection, which will be described in greater detail below, can be reduced to decrease thermal stress within the semiconductor package. The filler material may include silica, graphite, aluminum, carbon black, or the like or a combination thereof.

The resin substrate 10 may, for example, be provided as an epoxy resin substrate. The epoxy resin may include orthocresol type epoxy resin, novolac type epoxy resin, bisphenol type epoxy resin, or the like or a combination thereof.

Referring to FIG. 1B, an insulating buffer layer 11 may be formed on the resin substrate 10. The insulating buffer layer 11 may cover the bottom surface of the first recess 10b1 as well as side surfaces of the first recess 10b1. In one embodiment, the insulating buffer layer 11 may also cover bottom and side surfaces of the second recess 10b2. In another embodiment, the insulating buffer layer 11 may cover the peripheral region 10e. The insulating buffer layer 11 may include polyimide (PI), polybenzooxazole (PBO), benzocyclobutene (BCB), or the like or a combination thereof.

In one embodiment, the insulating buffer layer 11 may be omitted. When the insulating buffer layer 11 is not formed, the top surface of the resin substrate 10 (i.e., the bottom and side surfaces of the first recess 10b1, the bottom and side surfaces of the second recess 10b2, and the peripheral region 10e) can be surface-treated. As a result, the roughness of the top surface of the resin substrate 10 can be adjusted suitably. The surface treatment may be formed using a plasma, a laser, or the like or a combination thereof.

An interconnection 13 may be formed on the insulating buffer layer 11 or on the surface-treated resin substrate 10. The insulating buffer layer 11 can buffer a thermally-induced stress between the interconnection 13 and the resin substrate 10, thereby decreasing thermal stress within the semiconductor package. When the roughness of the top surface of the resin substrate 10 is suitably adjusted by the aforementioned surface treatment, adhesion between the interconnection 13 and the resin substrate 10 can be increased.

The interconnection 13 may, for example, be formed by patterning a seed layer (not illustrated) and a plating layer (not illustrated) that are sequentially stacked, or may be formed using an ink-jet print technique. The groove 10a can serve as an alignment key to form the interconnection 13. The interconnection 13 may include a first interconnection 13-1 disposed on the bottom surface of the first recess 10b1, a second interconnection 13-2 disposed on the bottom surface of the second recess 10b2, and a third interconnection 13-3 disposed on the peripheral region 10e. In the illustrated embodiment, the first, second and third interconnections 13-1, 13-2 and 13-3 are connected to one another. In another embodiment, one or more of the first, second and third interconnections 13-1, 13-2 and 13-3 are not connected to one another. The interconnection 13 may include a material such as copper, nickel, gold, or the like or a combination thereof.

An interlayer insulating layer 14 may be formed on the interconnection 13. Contact holes exposing portions of respective ones of the first, second and third interconnections 13-1, 13-2 and 13-3 may be formed in the interlayer insulating layer 14. The interlayer insulating layer 14 may include a polyimide (PI) layer, a polybenzooxazole (PBO) layer, a benzocyclobutene (BCB) layer, or the like or a combination thereof.

Referring to FIG. 1C, a first semiconductor chip 15-1 (e.g., an "upper semiconductor chip") is disposed in the first recess 10b1. The first semiconductor chip 15-1 may be connected to the first interconnection 13-1 through a first internal conductive protrusion 16-1 disposed on the bottom surface of the first semiconductor chip 15-1. A second semiconductor chip 15-2 (e.g., a "lower semiconductor chip") is disposed in the second recess 10b2. The second semiconductor chip 15-2 may be connected to the second interconnection 13-2 through a second internal conductive protrusion 16-2 disposed on the bottom surface of the second semiconductor chip 15-2.

When the interlayer insulating layer 14 is formed, the internal conductive protrusions 16-1 and 16-2 may be connected to respective ones of the first and second interconnections 13-1 and 13-2 through the contact holes.

Thereafter, an underfill resin layer 17 may be formed to substantially fill the first recess 10b1. In one embodiment, the underfill resin layer 17 may also substantially fill the second recess 10b2. Accordingly, the underfill resin layer 17 substantially fills a region between the second semiconductor chip 15-2 and the resin substrate 10 and substantially fills a region between the second semiconductor chip 15-2 and the first semiconductor chip 15-1 while also covering the side surface the second semiconductor chip 15-2 and the side surface of the first semiconductor chip 15-1. Thus, the side surfaces of the first and second semiconductor chips 15-1 and 15-2 are not exposed to an external environment and the damage due to external impacts can be significantly reduced or completely prevented. In one embodiment, the underfill resin layer 17 can tightly adhere the resin substrate 10 to the first and second semiconductor chips 15-1 and 15-2 and can prevent the first and second interconnections 13-1 and 13-2 and the internal conductive protrusions 16-1 and 16-2 from becoming corroded by moisture in the external environment. The underfill resin layer 17 may include polyimide resin, polyurethane resin, silicone resin, or the like or a combination thereof.

Referring to FIG. 1D, an external conductive protrusion 18 is disposed on the third interconnection 13-3. As a result, the external conductive protrusion 18 is electrically connected to the third interconnection 13-3.

A passivation layer 19 may be formed on the first semiconductor chip 15-1 and the peripheral region 10e before or after the external conductive protrusion 18 is disposed on the third interconnection 13-3. The passivation layer 19 may prevent the first semiconductor chip 15-1 from being exposed to the external environment. The passivation layer 19 may include an epoxy resin layer, or the like.

Referring to FIG. 1E, a region of the groove 10a is cut to separate unit semiconductor package regions. Upon cutting the region of the groove 10a, a semiconductor package (Pu) is fabricated.

FIGS. 3A through 3D are sectional views illustrating a method of fabricating a semiconductor package according to another embodiment of the present invention. The semiconductor package fabrication method illustrated in FIGS. 3A through 3D is similar to the semiconductor package fabrication method illustrated in FIGS. 1A through 1E. Differences between the semiconductor package fabrication method illustrated in FIGS. 1A through 1E and the semiconductor package fabrication method illustrated in FIGS. 3A through 3D will be apparent in view of the following description.

Figure 3A:
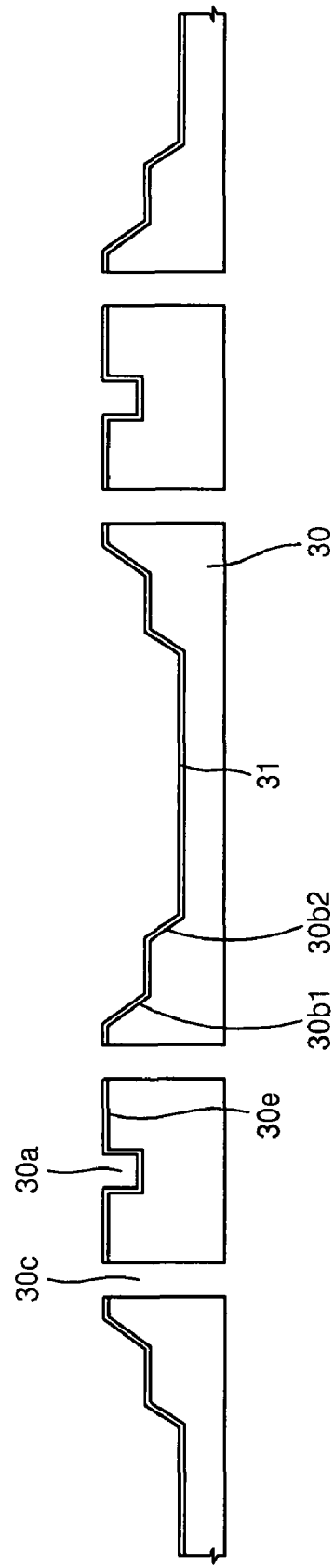
FIGS. 3A through 3D are sectional views illustrating a method of fabricating a semiconductor package according to another embodiment of the present invention.

Referring to FIG. 3A, a resin substrate 30 including a plurality of unit package regions is provided. The unit package regions may be defined by grooves 30a formed in the resin substrate 30, wherein the grooves 30a extend below an upper surface of the resin substrate 30. A first recess 30b1 is formed in each of the unit package regions and extends to a first level below the upper surface of the resin substrate 30. A peripheral region 30e is disposed between the first recess 30b1 and the grooves 30a, wherein the upper surface of the resin substrate 30 is disposed within the peripheral region 30e. Accordingly, the peripheral region 30e is disposed outside the first recess 30b1 at least an edge of the peripheral region 30e is defined by the first recess 30b1. In one embodiment, a second recess 30b2 extends below a bottom surface of the first recess 30b1 to a second level below the upper surface of the resin substrate 30. As illustrated, a width of an upper portion of the second recess 30b2 is less than a width of the bottom surface of the first recess 30b1. In another embodiment, however, the second recess 30b2 may be omitted.

An insulating buffer layer 31 may be formed on the resin substrate 30. The insulating buffer layer 31 may cover the bottom surface of the first recess 30b1 as well as side surfaces of the first recess 30b1. In one embodiment, the insulating buffer layer 31 may also cover bottom and side surfaces of the second recess 30b2. In another embodiment, the insulating buffer layer 31 may cover the peripheral region 30e.

In one embodiment, the insulating buffer layer 31 may be omitted. In such an embodiment, the top surface of the resin substrate 30 (i.e., the bottom and side surfaces of the first recess 30b1, the bottom and side surfaces of the second recess 30b2, and the peripheral region 30e) can be surface-treated.

A through hole 30c piercing the resin substrate 30 of the peripheral region 30e may be formed. In one embodiment, the through hole 30c may be formed after forming the insulating buffer layer 31 or after the top surface of the resin substrate 30 is surface-treated. The through hole 30c may be formed using a photolithography process, a laser drilling process, or the like of a combination thereof.

Figure 3B:
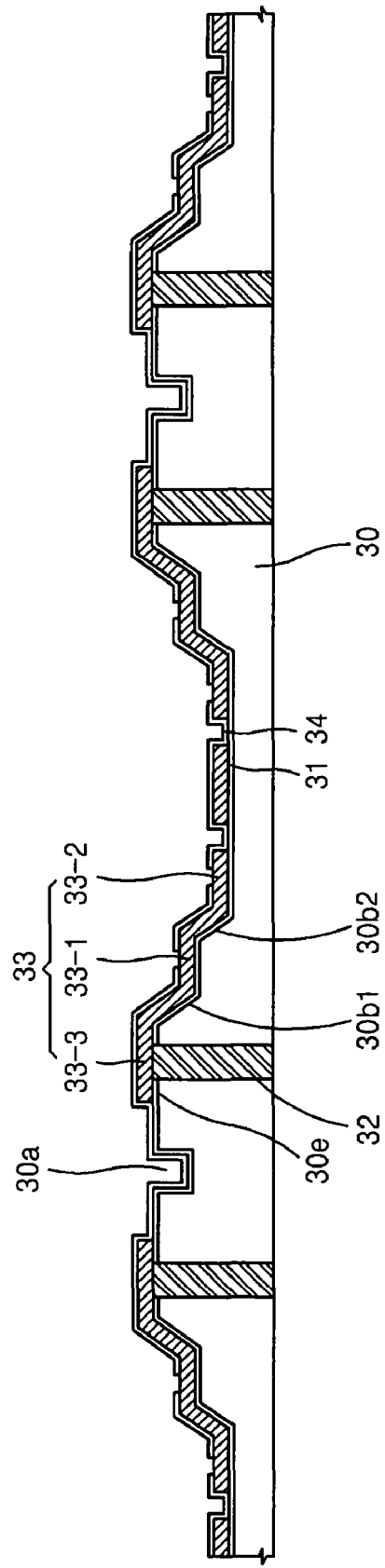

Referring to FIG. 3B, a conductive material is filled into the through hole 30c to form a through electrode 32 substantially filling the through hole 30c. In one embodiment, the through electrode 32 is exposed at the bottom surface of the resin substrate 30. The conductive material may include a material such as copper, nickel, gold, or the like or a combination thereof. The conductive material may be formed in the through hole 30c using an electrolytic plating process, a non-electrolytic plating process, an ink-jet process, or the like or a combination thereof.

An interconnection 33 may be formed on the resin substrate 30. In one embodiment, the interconnection 33 may be formed after the through electrode 32 is formed. The interconnection 33 may include a first interconnection 33-1 disposed on the bottom surface of the first recess 30b1, a second interconnection 33-2 disposed on the bottom surface of the second recess 30b2, and a third interconnection 33-3 disposed on the peripheral region 30e and connected to the through electrode 32.

An interlayer insulating layer 34 may be formed on the interconnection 33. Contact holes exposing portions of respective ones of the first and second interconnections 33-1 and 33-2 may be formed in the interlayer insulating layer 34.

Figure 3C:
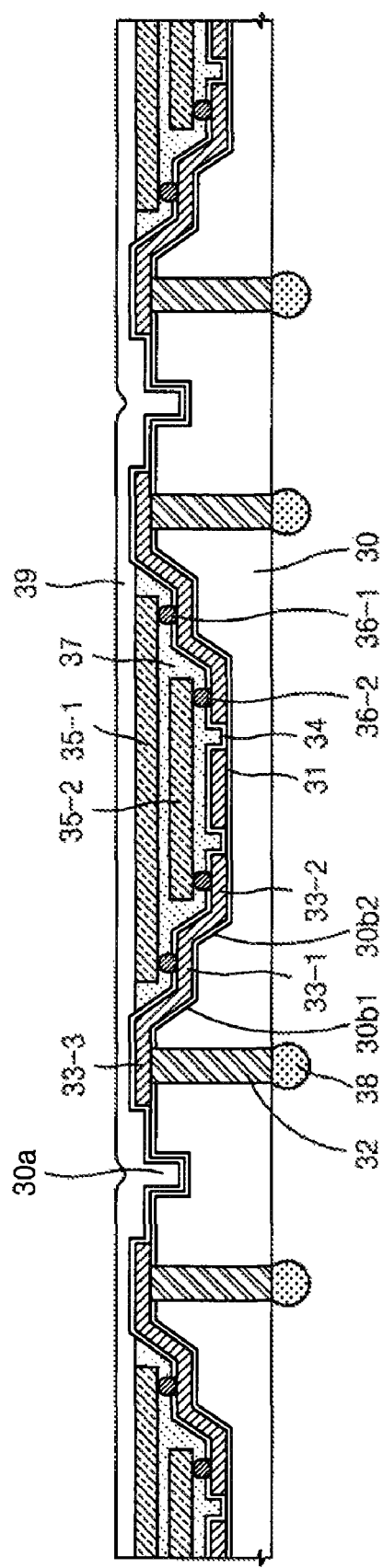

Referring to FIG. 3C, a first semiconductor chip 35-1 (e.g., an "upper semiconductor chip") is disposed in the first recess 30b1. The first semiconductor chip 35-1 may be connected to the first interconnection 33-1 through a first internal conductive protrusion 36-1 disposed on the bottom surface of the first semiconductor chip 35-1. A second semiconductor chip 35-2 (e.g., a "lower semiconductor chip") is disposed in the second recess 30b2. The second semiconductor chip 35-2 may be connected to the second interconnection 33-2 through a second internal conductive protrusion 36-2 disposed on the bottom surface of the second semiconductor chip 35-2.

When the interlayer insulating layer 34 is formed, the internal conductive protrusions 36-1 and 36-2 may be connected to respective ones of the first and second interconnections 33-1 and 33-2 through the contact holes.

Thereafter, an underfill resin layer 37 may be formed to substantially fill the first recess 30b1. In one embodiment, the underfill resin layer 37 may be formed to substantially fill the second recess 30b2. A passivation layer 39 may be formed on the first semiconductor chip 35-1 and the peripheral region 30e and an external conductive protrusion 38 is disposed on the through electrode 32 exposed at the bottom surface of the resin substrate 30. As a result, the external conductive protrusion 38 is electrically connected to the through electrode 32.

Figure 3D:
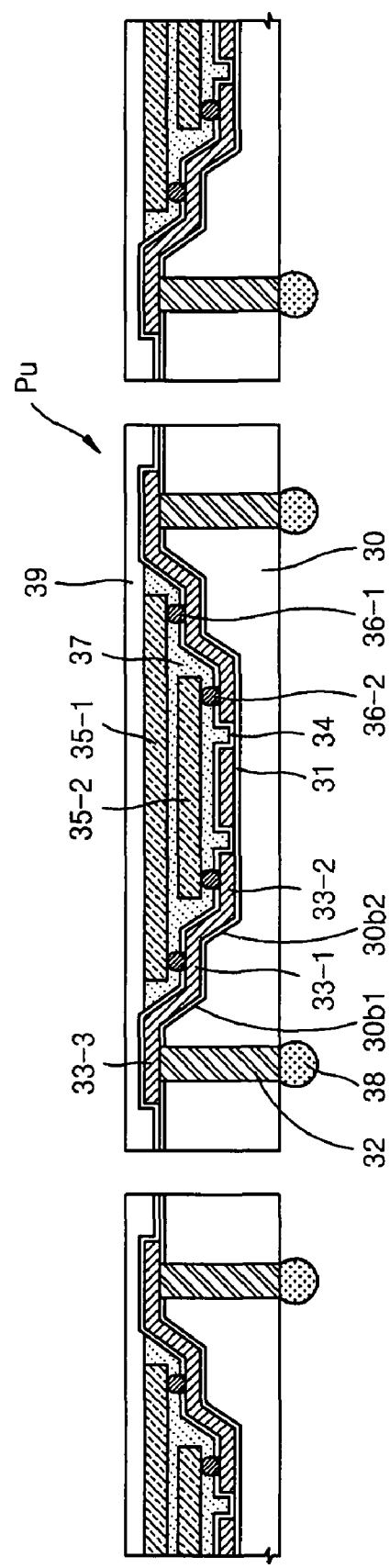

Referring to FIG. 3D, a region of the groove 30a is cut to separate unit semiconductor package regions. Upon cutting the region of the groove 30a, a semiconductor package (Pu) is fabricated.

Figure 4:
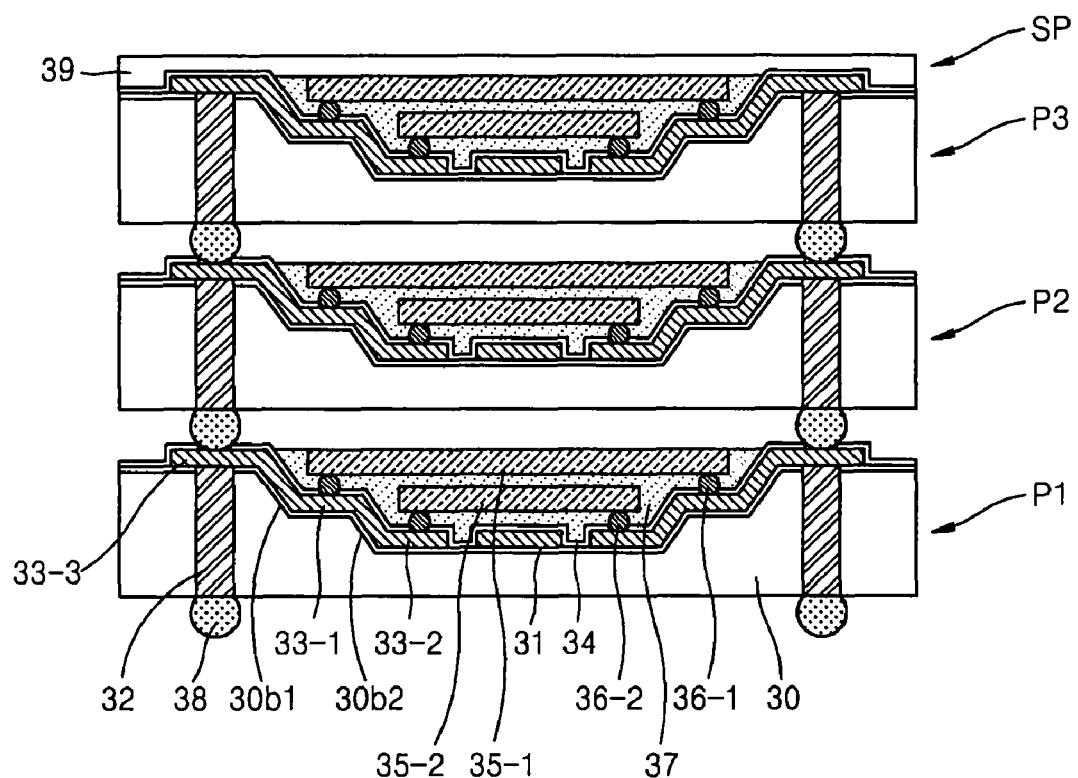
FIG. 4 is a sectional view of a stacked semiconductor package according to an embodiment of the present invention.

FIG. 4 is a sectional view of a stacked semiconductor package according to an embodiment of the present invention.

Referring to FIG. 4, first, second and third unit semiconductor packages P1, P2 and P3, respectively, are sequentially stacked to fabricate a stacked semiconductor package SP. Although FIG. 4 illustrates the stacked semiconductor package SP as having three unit semiconductor packages, it will be appreciated that the stacked semiconductor package SP may have any number of unit semiconductor packages.

In the illustrated embodiment, the third unit semiconductor package P3 can be provided as the semiconductor package described with reference to FIG. 3D. The second unit semiconductor package P2 can be substantially provided as the semiconductor package described with reference to FIG. 3D, but without the passivation layer 39. Moreover, the interlayer insulating layer 34 formed on a third interconnection 33-3 of the second unit semiconductor package P2 may further include a contact hole exposing the third interconnection 33-3. Accordingly, an external conductive protrusion 38 of the third unit semiconductor package P3 may be connected to the third interconnection 33-3 through the contact hole. The first unit semiconductor package P1 can be provided as described above with respect to the second unit semiconductor package P2.

As described above, interconnections can be formed on a resin substrate having an easily adjustable CTE. The resulting structure may be used as a circuit board capable of reducing the thermal stress of the semiconductor package. Also, recesses may be formed in the resin substrate and semiconductor chips may be disposed in the recesses. As a result the total thickness of the semiconductor package can be reduced. Further, an underfill resin layer may be disposed to substantially fill the recesses and cover the side surfaces of the semiconductor chips. As a result, damage to the semiconductor chips caused by an external impact can be reduced.

Embodiments of the present invention may be practiced in many ways, what follows in the paragraphs below is a non-limiting discussion of some exemplary embodiments.

According to one embodiment, a semiconductor package is provided. The semiconductor package may include a resin substrate. The resin substrate may include a first recess and a peripheral region disposed around the first recess. A first interconnection may be disposed on the bottom surface of the first recess. A first semiconductor chip may be disposed in the first recess. The first semiconductor chip may be connected to the first interconnection through a first internal conductive protrusion. An underfill resin layer fills the first recess and covers the side surface of the first semiconductor chip.

According to another embodiment, a method of fabricating a semiconductor package may include fabricating a resin substrate including a first recess and a peripheral region disposed around the first recess; forming a first interconnection on the bottom surface of the first recess; disposing a first semiconductor chip in the first recess, the first semiconductor chip being connected to the first interconnection through a first internal conductive protrusion; and forming an underfill resin layer filling the first recess and covering the side surface of the first semiconductor chip.

In one embodiment, the resin substrate including the first recess may be fabricated using a mold.

In one embodiment, the resin substrate may further include a plurality of unit package regions defined by a groove and wherein the first recess is formed in each of the unit package regions.

In one embodiment, the resin substrate including the groove and the first recess may be fabricated using a mold.

In one embodiment, the resin substrate may further include a second recess extending below the bottom surface of the first recess. A width of an upper portion of the second recess may be less than a width of the bottom surface of the first recess. The aforementioned method may further include forming a second interconnection on a bottom surface of the second recess simultaneous with the forming of the first interconnection; and disposing a second semiconductor chip in the second recess before disposing the first semiconductor chip, the second semiconductor chip being connected to the second interconnection through a second internal conductive protrusion.

In one embodiment, the underfill resin layer may fill the second recess and cover the side surface of the second semiconductor chip.

In one embodiment, the resin substrate including the first recess and the second recess may be fabricated using a mold.

In one embodiment, the aforementioned method may further include forming an insulating buffer layer disposed on the resin substrate to cover the bottom and side surfaces of the first recess before forming the first interconnection.

In one embodiment, the aforementioned method may further include forming an interlayer insulating layer on the first interconnection, wherein the interlayer insulating layer has a contact hole exposing a portion of the first interconnection. The first internal conductive protrusion may be connected to the first interconnection through the contact hole.

In one embodiment, the aforementioned method of may further include forming a third interconnection on the peripheral region simultaneously with the forming of the first interconnection; and disposing an external conductive protrusion on the third interconnection after the forming of the underfill resin layer.

In one embodiment, the aforementioned method may further include forming a through electrode extending through the peripheral region of the resin substrate; and forming a third interconnection on the through electrode simultaneously with the forming of the first interconnection.

In one embodiment, the aforementioned method may further include forming an external conductive protrusion connected to the through electrode exposed at the bottom surface of the resin substrate.

While embodiments of the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package, comprising:
a resin substrate including a first recess;
a first interconnection disposed on a surface of the first recess;
a first semiconductor chip disposed in the first recess and above the first interconnection, wherein the first semiconductor chip is electrically connected to the first interconnection;
an underfill resin layer substantially filling the first recess and covering a side surface of the first semiconductor chip; and
a passivation layer disposed on the first semiconductor chip.

2. A semiconductor package, comprising:
a substrate including a first recess;
a first interconnection disposed on a surface of the first recess;
a first semiconductor chip disposed in the first recess, wherein the first semiconductor chip is electrically connected to the first interconnection;
an underfill resin layer substantially filling the first recess and covering a side surface of the first semiconductor chip; and
a first internal conductive protrusion electrically connecting the first interconnection and the first semiconductor chip.

3. The semiconductor package of claim 2, further comprising an interlayer insulating layer disposed on the first interconnection,
wherein the interlayer insulating layer includes a contact hole exposing a portion of the first interconnection, and
wherein the first internal conductive protrusion extends through the contact hole.

4. A semiconductor package, comprising:
a resin substrate including a first recess;
a first interconnection disposed on a surface of the first recess;
a first semiconductor chip disposed in the first recess, wherein the first semiconductor chip is electrically connected to the first interconnection; and
an underfill resin layer substantially filling the first recess and covering a side surface of the first semiconductor chip;
wherein the resin substrate further includes a second recess extending below a bottom surface of the first recess, wherein a width of an upper portion of the second recess is less than a width of the bottom surface of the first recess and wherein the semiconductor package further comprises:

a second interconnection disposed on a surface of the second recess; and a second semiconductor chip disposed in the second recess, wherein the second semiconductor chip is electrically connected to the second interconnection.

5. The semiconductor package of claim 4, further comprising:

a first internal conductive protrusion electrically connecting the first interconnection and the first semiconductor chip; and a second internal conductive protrusion electrically connecting the second interconnection and the second semiconductor chip.

6. The semiconductor package of claim 4, wherein the second interconnection is electrically connected to the first interconnection.

7. A semiconductor package, comprising:

a resin substrate including a first recess;

a first interconnection disposed on a surface of the first recess;

a first semiconductor chip disposed in the first recess, wherein the first semiconductor chip is electrically connected to the first interconnection;

an underfill resin layer substantially filling the first recess and covering a side surface of the first semiconductor chip; and an insulating buffer layer disposed on the resin substrate and covering a bottom surface of the first recess and a side surface of the first recess, wherein the first interconnection is disposed on the insulating buffer layer.

8. The semiconductor package of claim 1, wherein the resin substrate includes a peripheral region outside the first recess, the semiconductor package further comprising:

a third interconnection disposed on the peripheral region; and an external conductive protrusion disposed on the third interconnection.

9. The semiconductor package of claim 1, wherein the resin substrate includes a peripheral region outside the first recess, the semiconductor package further comprising:

a third interconnection disposed on the peripheral region; and a through electrode extending through the resin substrate, wherein the through electrode is connected to the third interconnection.

10. The semiconductor package of claim 9, further comprising an external conductive protrusion disposed on the through electrode, wherein the through electrode electrically connects the external conductive protrusion and the third interconnection.

11. A semiconductor package, comprising:

a resin substrate having an upper surface and a first recess extending from the upper surface of the resin substrate to a first level below the upper surface of the resin substrate;

a first interconnection disposed within the first recess;

an insulating buffer layer disposed within the first recess between the resin substrate and the first interconnection, wherein the insulating buffer layer and the resin substrate comprise different materials; and a first semiconductor chip disposed within the first recess and electrically connected to the first interconnection.

12. The semiconductor package of claim 11, wherein the resin substrate further includes a second recess extending further from the first level below the upper surface of the resin substrate to a second level below the upper surface of the resin substrate, the semiconductor package further comprising:

a second interconnection disposed within the second recess; and a second semiconductor chip disposed within the second recess and electrically connected to the second interconnection, wherein the insulating buffer layer is disposed within second recess between the resin substrate and the second interconnection.

13. The semiconductor package of claim 12, further comprising:

an interlayer insulating layer disposed over at least one of the first interconnection and the second interconnection, wherein the interlayer insulating layer includes a contact hole exposing a portion of the at least one of the first interconnection and the second interconnection; and an internal conductive protrusion within the contact hole and electrically connecting the at least one of the first interconnection and the second interconnection with a corresponding one of the first semiconductor chip or second semiconductor chip.

14. The semiconductor package of claim 13, wherein the interlayer insulating layer contacts the insulating buffer layer within the second recess.

15. The semiconductor package of claim 13, further comprising an underfill resin layer substantially filling the first recess and the second recess.

16. A stacked semiconductor package, comprising:

a first unit semiconductor package;

a second unit semiconductor package disposed over the first unit semiconductor package; and an external conductive protrusion connected to the first unit semiconductor package and the second unit semiconductor package, wherein the first unit semiconductor package and the second unit semiconductor package each comprise:

a resin substrate including a first recess and a second recess, wherein a bottom surface of the first recess is disposed between an upper surface and a lower surface of the resin substrate and wherein a bottom surface of the second recess is disposed between the bottom surface of the first recess and the lower surface of the resin substrate;

an interconnection, wherein the interconnection is disposed within the first recess and the second recess;

a first semiconductor chip disposed in the first recess and electrically connected to the interconnection; and a second semiconductor chip disposed in the second recess and electrically connected to the interconnection, wherein the second unit semiconductor package further comprises a through electrode extending through the resin substrate and electrically connecting the interconnection of the second unit semiconductor package with the external conductive protrusion, and wherein the interconnection of the first unit semiconductor package is electrically connected to the external conductive protrusion.

17. The stacked semiconductor package of claim 16, wherein at least one of the first unit semiconductor package and the second unit semiconductor package further comprises an underfill resin layer substantially filling at least one of the first recess and the second recess.

18. The stacked semiconductor package of claim 16, wherein at least one of the first unit semiconductor package and the second unit semiconductor package further comprises an insulating buffer layer disposed between the resin substrate and the interconnection.

19. The stacked semiconductor package of claim 16, further comprising a passivation layer, wherein the single passivation layer is disposed on the first semiconductor chip of one of the first unit semiconductor package and the second unit semiconductor package.

* * * * *